US007863563B2

(12) United States Patent
Moore et al.

(10) Patent No.: US 7,863,563 B2
(45) Date of Patent: Jan. 4, 2011

(54) CARBON TUBE FOR ELECTRON BEAM APPLICATION

(75) Inventors: Lonn E. Moore, Millbrook, NY (US); Rajinder S. Dhaliwal, Hopewell Junction, NY (US); Maris A. Sturans, Galloway, NJ (US)

(73) Assignee: International Business Machines Corporation, Armonk, NY (US)

( * ) Notice: Subject to any disclaimer, the term of this patent is extended or adjusted under 35 U.S.C. 154(b) by 325 days.

(21) Appl. No.: 11/683,596

(22) Filed: Mar. 8, 2007

(65) Prior Publication Data

US 2008/0218054 A1 Sep. 11, 2008

(51) Int. Cl.
*G01N 23/00* (2006.01)
*G21K 7/00* (2006.01)
*A61N 5/00* (2006.01)
*G21G 5/00* (2006.01)

(52) U.S. Cl. .................. 250/306; 250/307; 250/310; 250/492.2; 250/492.3

(58) Field of Classification Search .............. 250/306, 250/307, 309, 310, 311, 396 R, 396 ML, 250/492.2, 492.3
See application file for complete search history.

(56) References Cited

U.S. PATENT DOCUMENTS

| 2,233,264 | A | * | 2/1941 | Marton | 250/396 ML |
|---|---|---|---|---|---|
| 3,634,684 | A | * | 1/1972 | Sato | 250/396 R |
| 3,818,412 | A | * | 6/1974 | Deardurff | 338/214 |
| 3,863,327 | A | * | 2/1975 | Legate et al. | 228/107 |
| 4,200,794 | A | * | 4/1980 | Newberry et al. | 250/396 ML |
| 4,658,137 | A | * | 4/1987 | Garth et al. | 250/310 |
| 5,041,731 | A | * | 8/1991 | Oae et al. | 250/396 ML |
| 5,376,792 | A | * | 12/1994 | Schamber et al. | 250/396 R |
| 5,719,402 | A | * | 2/1998 | Satoh et al. | 250/396 R |
| 5,770,862 | A | * | 6/1998 | Ooaeh et al. | 250/398 |
| 5,828,064 | A | * | 10/1998 | Knowles | 250/310 |
| 6,261,726 | B1 | * | 7/2001 | Brooks et al. | 250/492.2 |
| 6,586,746 | B1 | * | 7/2003 | Messick et al. | 250/396 R |
| 6,701,779 | B2 | * | 3/2004 | Volant et al. | 250/306 |
| 6,787,779 | B2 | * | 9/2004 | Tobias | 250/310 |
| 6,936,817 | B2 | * | 8/2005 | Feuerbaum | 250/310 |
| 7,264,850 | B1 | * | 9/2007 | Itoh et al. | 216/71 |
| 2002/0148971 | A1 | * | 10/2002 | Sogard | 250/396 R |
| 2003/0003838 | A1 | * | 1/2003 | Yamazaki et al. | 445/24 |
| 2004/0173747 | A1 | * | 9/2004 | Dean et al. | 250/310 |
| 2004/0183013 | A1 | * | 9/2004 | Nakasuji et al. | 250/310 |

OTHER PUBLICATIONS

Properties and Characteristics of Graphite for Industrial Applications. Sheppard et al. 1987. 50 pages.

* cited by examiner

*Primary Examiner*—Jack I Berman
*Assistant Examiner*—Brooke Purinton
(74) *Attorney, Agent, or Firm*—Yuanmin Cai

(57) ABSTRACT

Embodiments of the present invention provide an apparatus employing an electron beam to expose the structure of a micro device and produce an image of the structure. The apparatus includes an electron gun producing the electron beam; an electron beam column having one or more segments that shape, focus and/or deflect the electron beams; and one or more center tubes along the electron beam column that provides a high vacuum environment for and guiding the electron beam to a target object coated with an electron sensitive resist. At least one of the center tubes is a carbon tube made of solid carbon material.

18 Claims, 4 Drawing Sheets

CARBON TUBE FOR ELECTRON BEAM APPLICATION

FIELD OF THE INVENTION

The present invention relates in general to apparatus and/or arrangement employing electron beams and, more specifically, to apparatus and/or arrangement that applies carbon vacuum center tubes in electron beam control.

BACKGROUND OF THE INVENTION

Electron beams have been widely used in lithographic tools and/or microscopes in, for example, producing or obtaining images of structures of micro devices that are commonly found in semiconductor integrated circuits. In a typical apparatus or arrangement employing electron beams, a stream of electrons or charged particles may be emitted from or produced by a cathode. The stream of electrons may subsequently be accelerated to a desired velocity or energy level, by being subjected to a voltage difference or potential between the cathode and an anode, to propagate or travel along a column ("electron beam column") as an electron beam. During propagating or traveling, the electron beam may be shaped, focused and/or deflected along one or more stages or sections or segments of the column. The electron beam may finally hit a target object of interest, such as a semiconductor micro device, provide a desired exposure to the target object, and cause to produce an image of the target object, as is well known in the art.

An electron beam column may include one or more center tubes. As is well known in the art, in order to meet stringent requirements for high precision in both shape and position of an electron beam, center tubes are generally required to be able to provide a high degree of vacuum environment for the electron beam that travels inside. In addition, the center tubes may need to be able to avoid or eliminate as much as possible charging build-up on the inner surfaces that are visible to the electron beam. Moreover, in areas or segments where dynamic magnetic fields are applied, the center tubes may also need to be able to prevent or suppress eddy current that may otherwise adversely affect the beam focus and trajectory. Additionally, it is highly desirable that stray electrons (from the electron beam) that strike inner surfaces of the center tubes do not scatter or produce secondary electrons that could further impede beam focus and stability.

Most electron beam systems or apparatuses to date use non-conductive (e.g., glass, ceramic and/or plastic) center tubes to contain and maintain a vacuum environment, with a thin conductive layer of coating being applied to the inner surfaces of the center tubes to prevent the build-up of charges. In order to achieve relatively good performance, it is generally required that the coating being applied to the inner surfaces be made of materials that, when being exposed to air or an oxygen-containing environment, do not transform into an oxide insulating layer; be continuous, pinhole free; free of magnetic material contaminants; and be able to absorb partially or most of primary and secondary electrons. In addition, in order to be able to hold eddy current 1/e time constant below 3 micro-second, as is known in the art as being a common requirement, the coating may have a thickness of up to around 12 microns. However, applying a coating of this level of thickness is typically being associated with a difficult and low yield process. Furthermore, in addition to the above technical challenges, none of the current electron beam systems or apparatuses has effectively addressed problems such as, for example, electron absorption and scattering.

In certain electron beam systems, center tubes made of solid metal may be used in segments of the electron beam column where dynamic magnetic fields are not applied. However in situations like this, a thin layer of coating of Au, for example, may be needed in order to prevent the inner surface of the solid metal center tube from forming an oxide layer by the virtue of being exposed to air from time to time. Coupled with great level of difficulty, low yield, high cost, and low reliability (especially for longer tubes), some solid metal center tubes were fabricated in the past but so far none has demonstrated the desired electron absorption characteristic. Also in the past, some electron beam systems have used carbon material which may be strategically placed inside the vacuum near the electron beam to mitigate the problem of excessive electron scattering.

Therefore, there is a need in the art to create a better solution that may address the problems of current electron beam systems or apparatuses as described above. For example, a center tube that may mitigate the above described problems may be highly desirable.

SUMMARY OF THE INVENTION

Embodiments of the present invention provide a center tube that may be suitable for forming electron beam column in apparatus or arrangement employing electron beams such as a lithographic tool or microscope. The center tube has oxide free surfaces and strong electron absorptive properties. According to one embodiment, the center tube may be made of solid carbon requiring no conductive coating at its inner surface. Surfaces of the carbon tube may be treated with a layer of amorphous carbon to provide tight sealing for a high vacuum environment for electron beams traveling inside. When being exposed to air or an oxygen-containing atmosphere, oxidation of the bulk carbon material may produce only gases such as $CO$ and $CO_2$ and therefore may not cause the formation of any insulating layer covering the surfaces of the center tube. The resistance of the bulk carbon material may be sufficiently low such that it may not cause the accumulation of charges, yet high enough such that it may not produce undesirable eddy current in the presence of dynamic magnetic fields. In addition, the absorptive property of carbon may absorb most of the primary and secondary electrons that strike the surfaces when electron traveling inside; hence minimize "stray" electron effects, reduce backscattering, and improve beam stability.

Embodiments of the present invention provide an apparatus employing an electron beam to expose the structure of a micro device and produce an image of the structure. The apparatus includes an electron gun producing the electron beam; an electron beam column having one or more segments that shape, focus and/or deflect the electron beams; and one or more center tubes along the electron beam column that provides a high vacuum environment for and guiding the electron beam to a target object, wherein at least one of the center tubes is a carbon tube made of solid carbon material.

According to one embodiment, the carbon material making the center tube may include purified graphite having a particle size of 2 micro-meters or less and preferably 1 micro-meter or less, and at least the inner surface, and preferably all the surface, of the carbon tube is treated with a layer of amorphous carbon. According to another embodiment, the layer of amorphous carbon may infiltrate and lock onto the underlying carbon material to provide a high degree of vacuum environment for the electron beam traveling inside the carbon tube. For example, the amorphous carbon treated center tube may be able to provide a vacuum environment better than 1×10−6 Torr, and possibly better than 5×10−7 Torr, for the electron beam traveling inside.

According to embodiments of the present invention, the carbon tube may have an inner diameter ranging from about 1 inch to about 2 inches, a wall thickness of between about 0.2 inches and about 0.3 inch, and a length between about 1 inch and about 18 inches. The carbon tube may have a compressive strength between about 20 kpsi and about 30 kpsi, preferably around 28 kpsi, and a tensile strength between about 10 kpsi and about 16 kpsi, preferably around 13 kpsi. In addition, the carbon tube may an electrical resistivity between about 1650 and about 1850 micro-ohm-centimeters, and preferably around 1750 micro-ohm-centimeters.

Embodiments of the present invention provide a method for manufacturing center tubes used in electron beam apparatus out of solid carbon material.

BRIEF DESCRIPTION OF THE DRAWINGS

The present invention will be understood and appreciated more fully from the following detailed description of the invention, taken in conjunction with the accompanying drawings of which.

Figure 1:
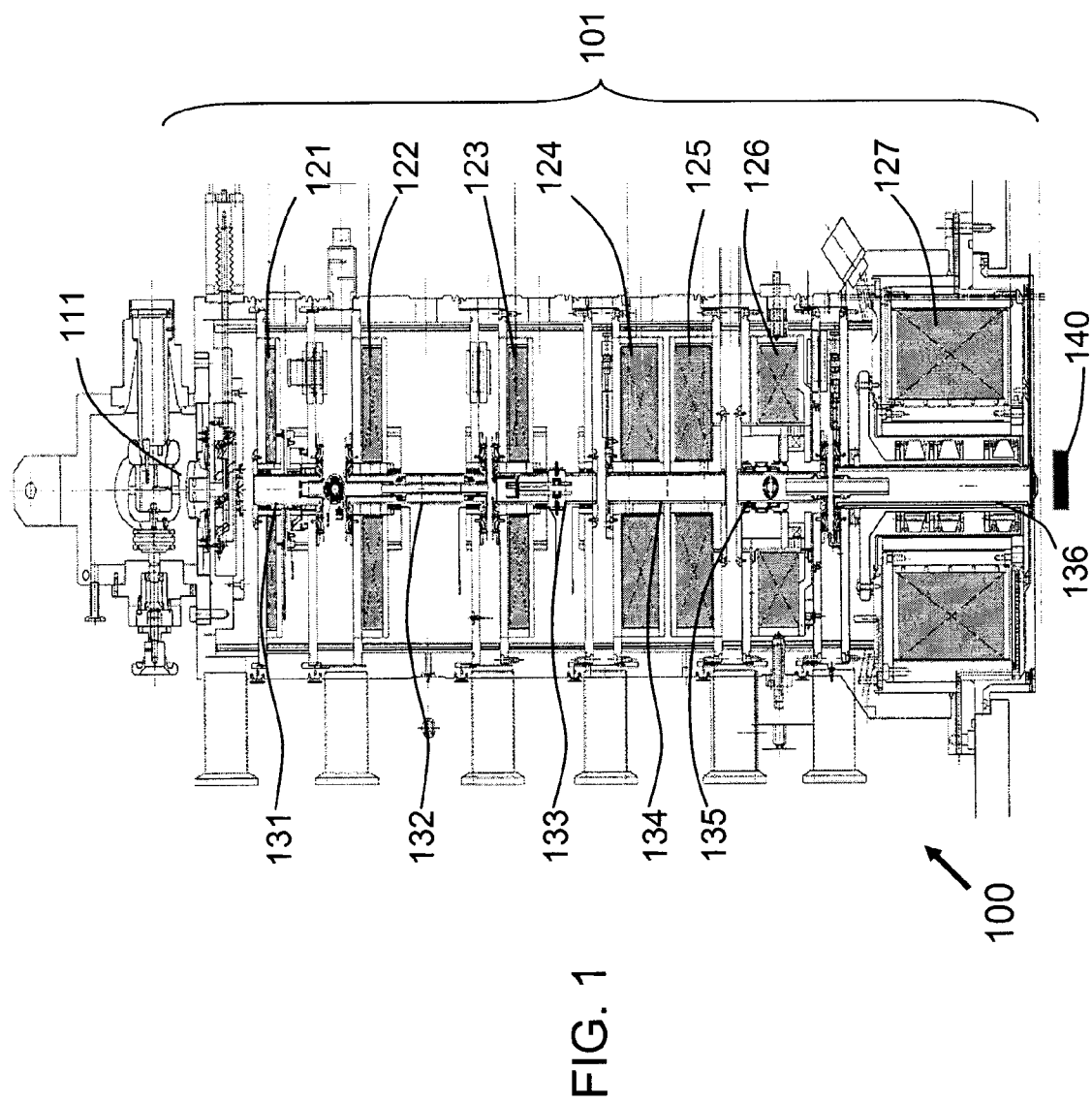
FIG. 1 is a simplified schematic illustration of an apparatus employing electron beam according to one embodiment of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

FIG. 1 is a simplified schematic illustration of an apparatus employing electron beam according to one embodiment of the present invention. Apparatus 100 in FIG. 1 may be an electron beam lithography tool and/or an electronic microscope. However, the present invention is not limited in this respect and apparatus 100 may be any apparatus or arrangement that employs electron beams or other types of charged particle beams. More specifically, apparatus 100 may include an electron gun 111 (which may include a cathode, a Wehnelt cup and an anode), one or more focusing coils 121, 122, 123, 124, 125, 126, and 127, and one or more center tubes 131, 132, 133, 134, 135, and 136 to form an electron beam column 101. Many other dynamic beam control elements such as, for example, shaping and blanking plates, dynamic stigmators and focus coils, magnetic deflectors and various apertures, may also be an integral part of column 101 but are not specifically called out in FIG. 1 for clarity purpose.

During operation of apparatus 100 in, for example, scanning images of a micro device, the electron gun 111 may produce a stream of high energy electrons. The high energy electrons may then be focused, shaped and deflected along a plurality of stages or segments of column 101, by a multitude of static and dynamic elements, for example focusing coils 121-127. The stream of electrons becomes an electron beam to travel along the path of column 101 formed by center tubes 131-136, and finally hits a target object 140 under investigation for exposure. In a lithographic tool like apparatus 100 in FIG. 1, an electron beam is usually employed to expose a pre-selected pattern on a target object like target object 140. The target object is typically coated with an electron sensitive "resist" material. The electron beam is scanned in a raster format on the target object and by proper selection and detection of the backscatter and/or secondary electrons an image of geometry of the target object and/or composition of target objects may be observed.

According to embodiment of the present invention, one or more of center tubes 131-136 may be made of bulk or solid carbon material ("carbon center tubes"), as is described below in detail with reference to FIGS. 2-4. Surface of the carbon center tubes, inside and outside, may be treated with a layer of amorphous carbon such that the carbon center tubes may be able to maintain a high degree of vacuum condition inside. The use of bulk or solid carbon material may dramatically reduce accumulation of charges along the inner surface of the carbon center tube, partially because of the relatively low resistance of the carbon material. On the other hand, in the presence of dynamic magnetic fields, the resistance of carbon material may be sufficient to suppress or reduce eddy current.

Center tubes made with solid carbon material, according to one embodiment, may absorb, at least partially and maybe most of, primary and secondary electrons that strike the inner surface and reduce the "stray" electron effects. Center tubes made with solid carbon material, according to another embodiment, may be able to maintain a vacuum condition or environment for the electron beam traveling therein. Center tubes made with solid carbon material, according to yet another embodiment, may be able to avoid the formation of insulating material on the inner surface when being exposed to air or an oxygen containing environment, as compared with other conventional metal center tube. The prevention of formation of insulating material is achieved due to the fact that the oxidation of solid carbon material (used in making the center tubes) may only produce gases such as, for example, $CO$ and/or $CO_2$. According to a further embodiment of the present invention, the use of solid carbon material may simplify the process of manufacturing center tubes because the conductive property of the center tubes made of solid carbon material no longer requires any separate coating on the inner surface. Advantages of this solid carbon center tube become obvious when being compared with a conventional center tube which uses either non-conductive material which requires a conductive coating or solid metal which requires an Au coating to prevent forming an insulating layer due to oxidation.

Figure 2:
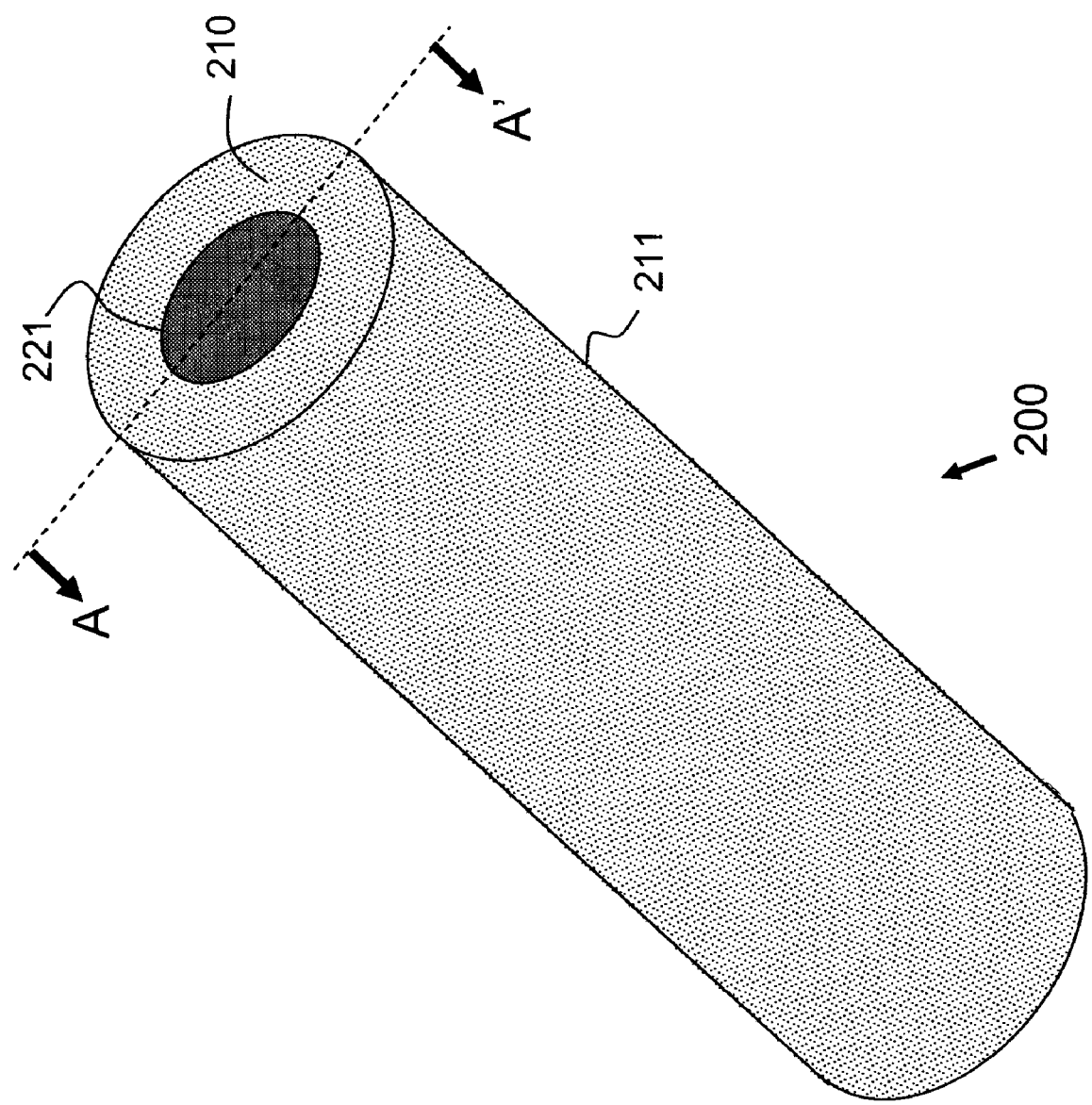
FIG. 2 is a simplified schematic illustration of a center tube according to one embodiment of the present invention.

FIG. 2 is a simplified schematic illustration of a center tube according to one embodiment of the present invention. A typical center tube 200 may have an inner diameter of one (1) to two (2) inches with a wall thickness of ⅛ inch. However a person skilled in the art will appreciate that the present invention is not limited in this respect and other sizes of center tubes with different inner and outer diameters may be possible. Furthermore, shapes of center tube 200 may not be limited to cylindrical and other shapes of center tubes may be used.

Center tube 200 may be a carbon tube made of bulk or solid graphite 210 with a particle size of less than two (2) microns and preferably less than one (1) micron. Graphite 210 may be a graphite of purified fine grain with relatively high strength. According to one embodiment, graphite 210 may be suitable for machining and so may be machined to the shape of center tube 200 as shown in FIG. 2. Preferably, corners of center tube 200, for example areas around the outer perimeters of top and bottom surfaces, may be rounded such that they become suitable for applying vacuum sealing devices such as, for example, o-rings and/or caps. After being machined to a desired shape, most surfaces of center tube 200, preferably all the surfaces of center tube 200 including inner surface 221, outer surface 211, and top and bottom surfaces, may be treated with a layer of amorphous carbon. The amorphous carbon treatment may form a layer of coating, which may infiltrate and lock onto graphite 210 underneath; creating a hard, abrasion resistant surface that will produce no particles. Consequently, center tube 200 may be able to contain or hold and/or maintain a relatively good vacuum condition inside. For example, a vacuum condition of better than $1 \times 10^{-6}$ Torr, possibly better than $5 \times 10^{-7}$ Torr, may be achieved inside the carbon center tube 200.

According to one embodiment of the present invention, bulk graphite 210 of center tube 200 may have a compressive strength between 24 kpsi and 30 kpsi, preferably about 28 kpsi, and a tensile strength between 10 kpsi and 16 kpsi, preferably about 13 kpsi. As described above, graphite 210 of center tube 200 may have a typical particle size of less than 2 microns and preferably less than 1 micron, and an average pore size of about 0.2 microns. Electrical resistivity of graphite 210 may be between 1600 to 1900 micro-ohm-centimeters, and preferably about 1750 micro-ohm-centimeters.

According to one embodiment, oxidation of graphite 210 of center tube 200 may only produce gases of CO or $CO_2$. Therefore, with an oxidation temperature threshold around 460 degree C., any oxidation of graphite 210 may not cause formation of insulating materials or films of oxide alike on the surface of center tube 200. In addition, graphite 210 may be purified, during the manufacturing process for center tube 200, to an average purity of less then about 700 ppm-total ash, and have an average density about 1.8 gms/cm³.

According to embodiments of the present invention, center tube 200 of different diameters and different lengths may be used to replace one or more conventional center tubes, which may be made of non-conductive material or solid metal, used in apparatus and/or arrangement that employ electron beams or other types of charged particle beams. More specifically, center tube 200 may be used as one or more of center tubes 131, 132, 133, 134, 135, and/or 136 as illustrated in FIG. 1.

Figure 3:
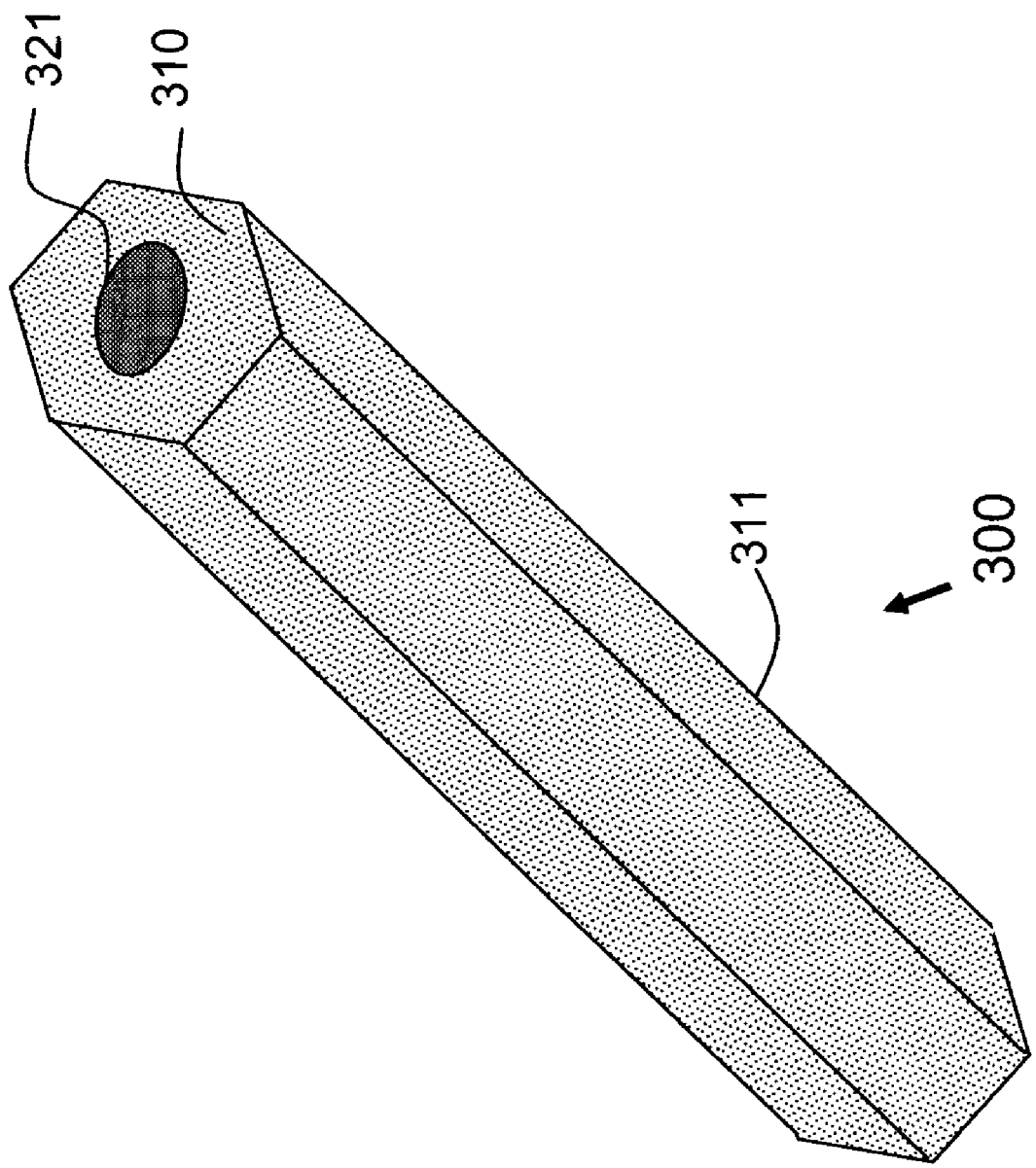
FIG. 3 is a simplified schematic illustration of a center tube according to another embodiment of the present invention.

FIG. 3 is a simplified schematic illustration of a center tube according to another embodiment of the present invention. Center tube 300 may be a carbon tube made of bulk or solid graphite 310, which may have similar properties as graphite 210 of center tube 200 described above in detail with regard to FIG. 2. However, center tube 300 may be in a different shape from center tube 200, for example, in a non-cylindrical shape. For example, center tube 300 may have an inner surface of circular or oval shape, and an outer surface made to conform to any unique column geometric requirement. Similar to center tube 200, surface of center tube 300 may be treated with a layer of amorphous carbon for better sealing capability.

On the other hand, in order to apply vacuum sealing, the two ends (top and bottom surfaces) of center tube 300 may be preferably rounded (not shown) to have a cylindrical outer diameter such that both the top and bottom surfaces become suitable for applying a vacuum sealing means of, for example, an o-ring. However, a person skilled in the art will appreciate that the present invention is not limited in this respect. For example, since other vacuum sealing means may be effectively applied to carbon center tube 300, the top and bottom surfaces of center tube 300 may be tailored or shaped to suit for a particular vacuum sealing means, which may not always require a cylindrical shape.

Figure 4:
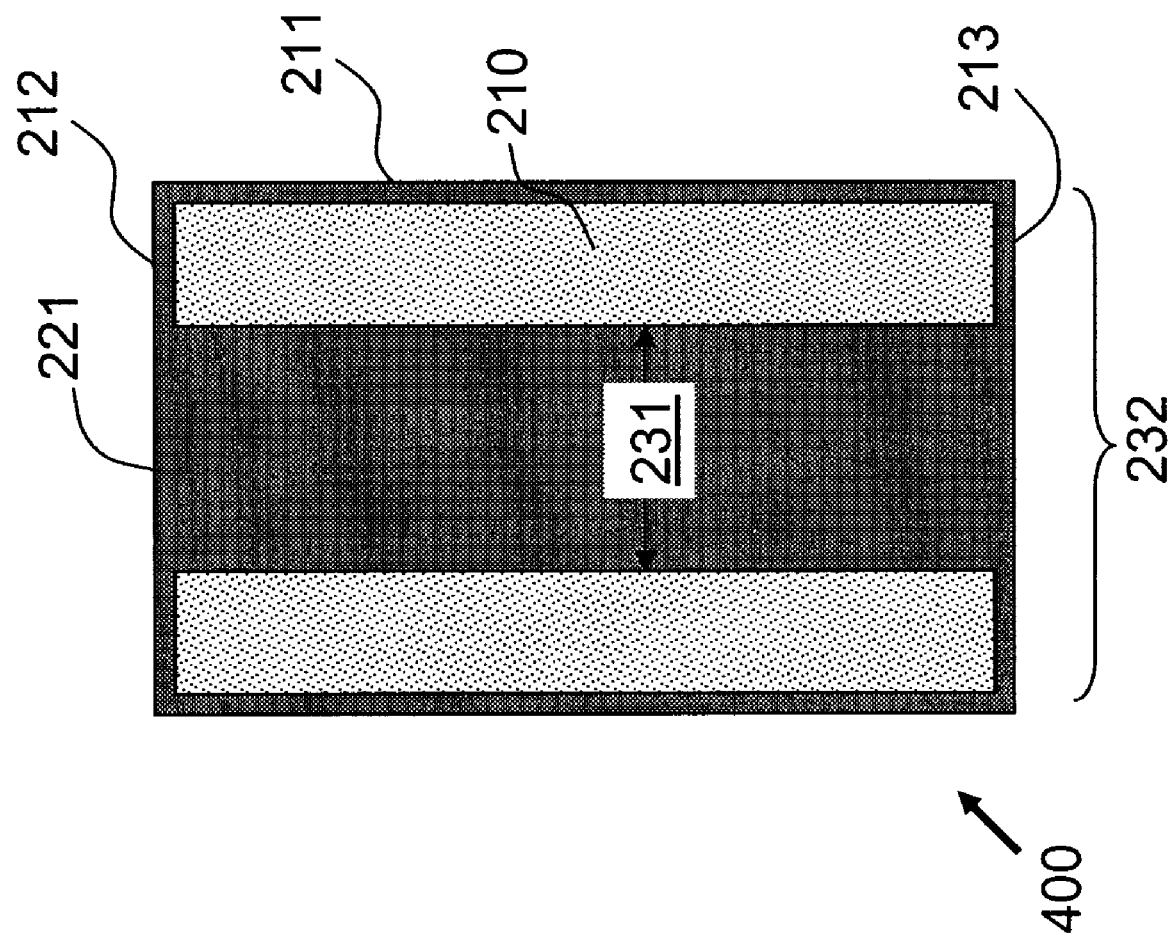
FIG. 4 is a schematic cross-sectional view of a center tube according to a further embodiment of the present invention.

FIG. 4 is a schematic cross-sectional view of a center tube according to one of the embodiments of the present invention. Cross-section 400 of center tube 200 may be a cross-section taken along the A-A' direction in FIG. 2. In FIG. 4, inner surface 221, outer surface 211, top surface 212, and bottom surface 213 are all illustrated to have been preferably treated with a layer of amorphous carbon in order to provide a hard, abrasion resistant surface. However, the present invention is not limited in this respect. For example, outer surface 211 may be treated differently from inner surface 221, or sometimes even not treated, so long as the treated center tube 200 may still have the sealing capability to provide the desired vacuum environment. In addition, corners of the top and bottom surfaces may be machine-rounded (not shown) or made o-ring friendly before the amorphous carbon treatment. However, the present invention is not limited in this either. Since other vacuum sealing means may equally be applied as well, the ends of center tube 200 may be machined to suit that particular vacuum sealing requirement. Center tube 200 has an inner diameter 231 and an outer diameter 232.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. An apparatus employing charged particle beams to expose structures of micro devices and produce images of said micro devices, said apparatus comprising:
 a cathode producing said charged particle beams;
 a plurality of stages of an electron beam column that shape, focus and/or deflect said charged particle beams; and
 a plurality of center tubes that are stacked vertically, each of the plurality of center tubes provides a vacuum environment for guiding said charged particle beams to a target object, said target object being coated with an electron sensitive resist,
 wherein at least one of said center tubes is a carbon tube made of bulk carbon material, and wherein said carbon tube is treated with a layer of amorphous carbon covering at least the inner surface of said carbon tube.

2. The apparatus of claim 1, wherein said carbon material comprises carbon graphite having a particle size less than 2 micro-meters.

3. The apparatus of claim 1, wherein said layer of amorphous carbon seals said surfaces of said carbon tube by infiltrating and locking onto underlying said carbon material which makes said carbon tube.

4. The apparatus of claim 1, wherein the inner surface of said carbon tube is substantially circular and has a diameter between about 1 inch and about 2 inches.

5. The apparatus of claim 1, wherein said carbon tube has a length between about 1 inch and about 18 inches.

6. The apparatus of claim 1, wherein more than one center tubes are carbon tubes made of bulk carbon material, said carbon material comprises purified graphite with a particle size of 2 micro-meters or less.

7. The apparatus of claim 1, wherein said carbon tube has a compressive strength between about 20 kpsi and about 30 kpsi.

8. The apparatus of claim 1, wherein said carbon tube has a tensile strength between about 10 kpsi and about 16 kpsi.

9. The apparatus of claim 1, wherein said carbon tube has an electrical resistivity between about 1600 and about 1900 micro-ohm-centimeters.

10. An apparatus employing an electron beam to expose structure of a micro device and produce an image of said structure, said apparatus comprising:
an electron gun producing said electron beam;
an electron beam column having one or more segments that shape, focus and/or deflect said electron beams; and
multiple center tubes that are vertically stacked along said electron beam column and each of said
multiple center tubes provides a high vacuum environment for and guiding said electron beam to a target of said micro device,
wherein at least one of said multiple center tubes is a carbon tube made of solid carbon material, and
wherein at least the inner surface of said carbon tube is treated with a layer of amorphous carbon.

11. The apparatus of claim 10, wherein said carbon material comprises purified graphite having a particle size of 2 micro-meters or less.

12. The apparatus of claim 11, wherein said layer of amorphous carbon infiltrates and locks onto underlying said carbon material, said center tube being able to provide a high degree of vacuum environment for said electron beam traveling inside.

13. The apparatus of claim 12, wherein said amorphous carbon treated center tube is able to provide a vacuum environment better than $1 \times 10^{-6}$ Torr for said electron beam traveling inside.

14. The apparatus of claim 10, wherein said carbon tube has an inner diameter ranging from about 1 inch to about 2 inches, a wall thickness of between about 0.2 inches and about 0.3 inch, and a length between about 1 inch and about 18 inches.

15. The apparatus of claim 10, wherein said carbon tube has a compressive strength between about 20 kpsi and about 30 kpsi, and a tensile strength between about 10 kpsi and about 16 kpsi.

16. The apparatus of claim 10, wherein said carbon tube has an electrical resistivity between about 1600 and about 1900 micro-ohm-centimeters.

17. A method of guiding electron beams inside an apparatus employing said electron beams to expose the structure of a micro device on a silicon wafer coated with electron sensitive resist and to produce an image of said structure, said method comprising:
producing an electron beam using an electron gun;
providing multiple center tubes that are stacked vertically and made of bulk carbon material for said electron beam to travel therein thus reducing electron backscattering from the inner surface of said center tubes; treating the surface of at least one of said center tubes with a layer of amorphous carbon such that said center tube is able to provide a high vacuum environment for said electron beam traveling inside; and shaping, focusing and/or deflecting said electron beam when traveling along said set of center tubes.

18. The method of claim 17, further comprising forming a hard, abrasion resistant layer on the inner surface of said center tubes by causing said layer of amorphous carbon to infiltrate and lock onto said carbon material that makes said center tubes.

* * * * *